United States Patent
Ohta

(10) Patent No.: US 10,416,000 B2
(45) Date of Patent: Sep. 17, 2019

(54) POSITION DETECTION DEVICE HAVING MAGNETORESISTIVE ELEMENT

(71) Applicant: TDK Corporation, Tokyo (JP)

(72) Inventor: Naoki Ohta, Tokyo (JP)

(73) Assignee: TDK Corporation, Tokyo (JP)

(*) Notice: Subject to any disclaimer, the term of this patent is extended or adjusted under 35 U.S.C. 154(b) by 135 days.

(21) Appl. No.: 15/652,640

(22) Filed: Jul. 18, 2017

(65) Prior Publication Data

US 2018/0094950 A1 Apr. 5, 2018

(30) Foreign Application Priority Data

Oct. 3, 2016 (JP) .................................. 2016-195442

(51) Int. Cl.
  *G01R 33/09* (2006.01)
  *G01D 5/165* (2006.01)
  *G01D 5/245* (2006.01)

(52) U.S. Cl.
  CPC ........... *G01D 5/165* (2013.01); *G01R 33/098* (2013.01); *G01D 5/245* (2013.01)

(58) Field of Classification Search
  CPC ....... G01D 5/165; G01D 5/245; G01R 33/098
  USPC ........ 324/200, 207.2–207.23, 205, 210, 219, 324/228, 244, 252, 262, 500, 750.12, 324/750.21, 754.17, 754.29
  See application file for complete search history.

(56) References Cited

U.S. PATENT DOCUMENTS

| | | | | |
|---|---|---|---|---|
| 2004/0114275 A1* | 6/2004 | Ezaki | ...................... | G11C 11/16 360/110 |
| 2015/0221862 A1* | 8/2015 | Uchida | ................... | H01L 43/10 257/421 |

FOREIGN PATENT DOCUMENTS

| | | |
|---|---|---|
| JP | 2009-260164 A | 11/2009 |
| JP | 2014-035184 | 12/2013 |
| JP | 2014-016161 A | 1/2014 |
| WO | 2009078296 A1 | 6/2009 |

OTHER PUBLICATIONS

Office action dated Aug. 22, 2017 in corresponding JP application No. JP2016195442 (and English abstract translation attached).

* cited by examiner

*Primary Examiner* — Melissa J Koval
*Assistant Examiner* — Trung Nguyen
(74) *Attorney, Agent, or Firm* — Posz Law Group, PLC

(57) ABSTRACT

A magnetoresistive element is provided with a plurality of magnetoresistive laminated bodies arranged in an array and a plurality of lead electrodes that electrically connect the plurality of magnetoresistive laminated bodies in series. A first lead electrode electrically connected to a first surface in the lamination direction of a first magnetoresistive laminated body among the plurality of magnetoresistive laminated bodies and a second lead electrode electrically connected to a first surface in the lamination direction of a second magnetoresistive laminated body adjacent in the series direction are electrically connected without a magnetoresistive laminated body being interposed in between.

7 Claims, 7 Drawing Sheets

POSITION DETECTION DEVICE HAVING MAGNETORESISTIVE ELEMENT

CROSS REFERENCE TO RELATED APPLICATIONS

The present application is based on Japanese Patent Application No. 2016-195442 filed on Oct. 3, 2016, the disclosure of which is incorporated herein by reference.

TECHNICAL FIELD

The present invention relates to a magnetoresistive element and a method of manufacturing such, along with a position detection device having the magnetoresistive element.

BACKGROUND

Conventionally, position detection devices have been used to detect the position and amount of movement (amount of change) through the rotational movement or linear movement of a moving body, in machine tools and the like. As this kind of position detection device, a device has been known that is provided with a magnetic sensor capable of detecting change in an external magnetic field accompanying movement of the moving body, and a signal indicating the relative positional relationship between the moving body and a magnetic sensor is output from the magnetic sensor.

As the magnetic sensor used in such a position detection device, a sensor that is a laminated body having a free layer and a magnetization fixed layer and provided with a magnetoresistive element (TMR element) in which resistance varies with a change in the magnetization direction of the free layer in accordance with an external magnetic field is known.

The TMR element includes a plurality of magnetoresistive laminated bodies (TMR laminated bodies) connected in series. The TMR laminated bodies have low electrostatic discharge (ESD) tolerance, and there is a risk that the TMR laminated bodies could be destroyed if excess voltage or excess current caused by a surge in static electricity or the like flows. Consequently, a plurality of TMR laminated bodies is connected in series in the TMR element for the purposes of reducing the voltage applied to each of the TMR laminated bodies and to improve ESD tolerance.

PRIOR ART

Patent Literature

[PATENT LITERATURE 1] JP Laid-Open Patent Application No. 2009-260164.

SUMMARY

Problem to be Solved by the Invention

Each TMR laminated body in the above-described TMR element is designed so that the shape when viewed from above or below the lamination direction is circular. By making the shape of the TMR laminated bodies circular, it is possible to cause the magnetization direction of the free layer to change linearly accompanying changes in the external magnetic field, so it is possible to show stable change in resistance, making highly precise position detection by the magnetic sensor possible. However, there are cases in which distortion occurs in the shape of each of the TMR laminated bodies due to errors or the like when manufacturing the TMR laminated bodies. The problem exists that harmonic distortion is included in the signal waveform output from the magnetic sensor, originating from distortion of the shape of each of the TMR laminated bodies, in particular, the shape of the free layer. In particular, as equipment provided with magnetic sensors has become more compact and more highly functional, detecting the position of the moving body with higher precision has been sought, creating circumstances in which even minute detection errors caused by slight distortion of the shape of the above-described TMR laminated bodies cannot be ignored.

In order to correct the harmonic distortion, even if an attempt is made to correct the distortion of the shape of each TMR laminated body, the correction amount is a slight amount that is less than the measurement limit in the measuring length SEM or the like, so it is extremely difficult to manage this correction amount In addition, for example, in a typical resistor that is manufactured through a method such as screen printing or the like, in order to get the resistance value to match the designed value, a laser trimming process is accomplished by irradiating a laser on the resistor while monitoring the resistance value of the manufactured resistor. However, even if the attempt is made to correct distortion of the shape of each of the TMR laminated bodies by accomplishing the laser trimming process of irradiating a laser on each of the TMR laminated bodies, there is a risk that the film structure of the TMR laminated bodies could be destroyed by the laser being irradiated.

In consideration of the above-described problems, it is an object of the present invention to provide a magnetoresistive element in which harmonic distortion caused by distortion of the shape of each magnetoresistive laminated body due to manufacturing errors or the like can be corrected and which can show stable changes in resistance value accompanying changes in the external magnetic field, a method of manufacturing such, and a position detection device including such a magnetoresistive element

Means for Solving the Problem

In order to resolve the above-described problems, the present invention provides a magnetoresistive element comprising a plurality of magnetoresistive laminated bodies arranged in an array, and a plurality of lead electrodes that electrically connect the plurality of magnetoresistive laminated bodies in series; wherein the plurality of magnetoresistive laminated bodies includes a first magnetoresistive laminated body and a second magnetoresistive laminated body, which is adjacent in the series direction to the first magnetoresistive laminated body. The plurality of lead electrodes includes a first lead electrode, which is electrically connected to a first surface in the lamination direction of the first magnetoresistive laminated body, and a second lead electrode, which is electrically connected to the first surface in the lamination direction of the second magnetoresistive laminated body and positioned substantially coplanar with the first lead electrode. The first lead electrode and the second lead electrode are electrically connected without the magnetoresistive laminated body being interposed in between (Invention 1).

In the above-described invention (Invention 1), at least one electrode connection lead that directly connects at least two lead electrodes among the plurality of lead electrodes is further provided, and the first lead electrode and the second lead electrode are preferably connected via the electrode connection lead (Invention 2).

In the above-described invention (Invention 1), in a planar view from a first surface side of the magnetoresistive laminated body, at least one of the magnetoresistive laminated bodies included in the plurality of magnetoresistive laminated bodies preferably has a shape and/or size differing from the other magnetoresistive laminated bodies (Invention 3). Preferably at least one of the magnetoresistive laminated bodies has a substantially elliptical shape, and the other magnetoresistive laminated bodies have substantially circular shapes (Invention 4). Preferably the size of at least one of the magnetoresistive laminated bodies is at least 1.5 times larger than the sizes of the other magnetoresistive laminated bodies (Invention 5).

In the above-described invention (Invention 1), it is possible to use a TMR laminated body as the magnetoresistive laminated body.

In addition, the present invention provides a position detection device comprising a magnetic sensor unit that outputs a sensor signal based on changes in an external magnetic field accompanying movements of a moving body, and a position detection unit that detects the position of the moving body based on the sensor signal output from the magnetic sensor unit. The magnetic sensor unit includes the magnetoresistive element according to the above-described invention (Invention 1) (Invention 7).

In the above-described invention (Invention 7), it is preferred that the moving body is a rotating moving body that rotationally moves about a prescribed axis of rotation and that the position detection unit detects the rotational position of the rotating moving body based on the sensor signal output from the magnetic sensor unit (Invention 8).

Furthermore, the present invention provides a manufacturing method for a magnetoresistive element including a process for forming a plurality of bottom lead electrodes, a process for forming a magnetoresistive laminated body in a portion of the magnetoresistive laminated body formation regions among a plurality of magnetoresistive laminated body formation regions set in each of the plurality of bottom lead electrodes, a process for forming a measurement lead on each top surface of at least two of the magnetoresistive laminated bodies, a process for applying an electric current on the magnetoresistive laminated bodies via the measurement lead, and measuring resistance value changes in the magnetoresistive laminated bodies accompanying changes in an external magnetic field, a process for forming magnetoresistive laminated bodies in regions where magnetoresistive laminated bodies are not formed, among the plurality of magnetoresistive laminated body formation regions, based on the measurement results of the resistance value changes, and a process for forming a plurality of top lead electrodes that connect the magnetoresistive laminated bodies in series (Invention 9).

In the above-described invention (Invention 9), it is preferable that the method further includes a process for finding the change in a correction-use resistance value in order to correct the resistance value change that has been measured, and that a magnetoresistive laminated body is formed in a region where a magnetoresistive laminated body has not been formed, among the plurality of magnetoresistive laminated body formation regions, based on change in the correction-use resistance value (Invention 10).

Efficacy of the Invention

With the present invention, it is possible to provide a magnetoresistive element in which harmonic distortion caused by distortion of the shape of each magnetoresistive laminated body due to manufacturing errors or the like can be corrected and which can show stable changes in resistance value accompanying changes in the external magnetic field, a method of manufacturing such, and a position detection device including such a magnetoresistive element

DETAILED DESCRIPTION

Figure 1:
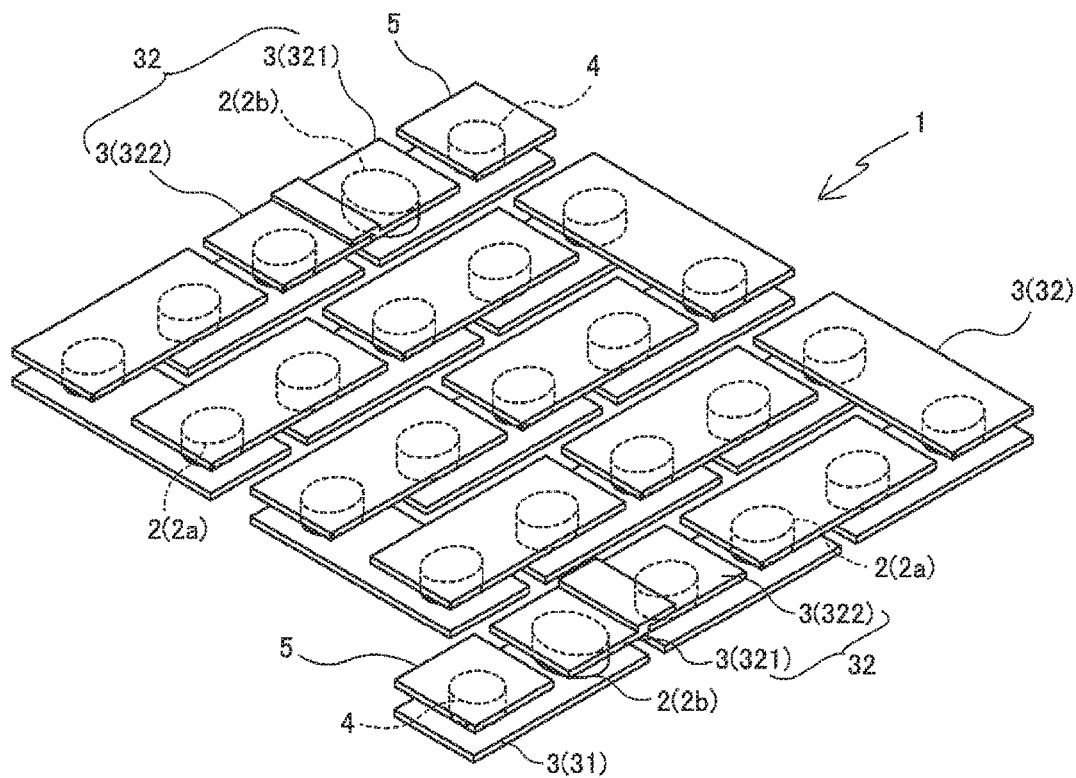
FIG. 1 is a perspective view showing a schematic configuration of a magnetoresistive element according to a preferred embodiment of the present invention.
Figure 2:
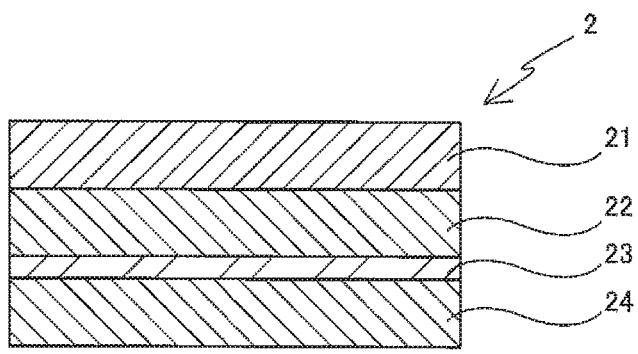
FIG. 2 is a cross-sectional view showing a schematic configuration of a magnetoresistive laminated body in the preferred embodiment of the present invention.
Figure 3:
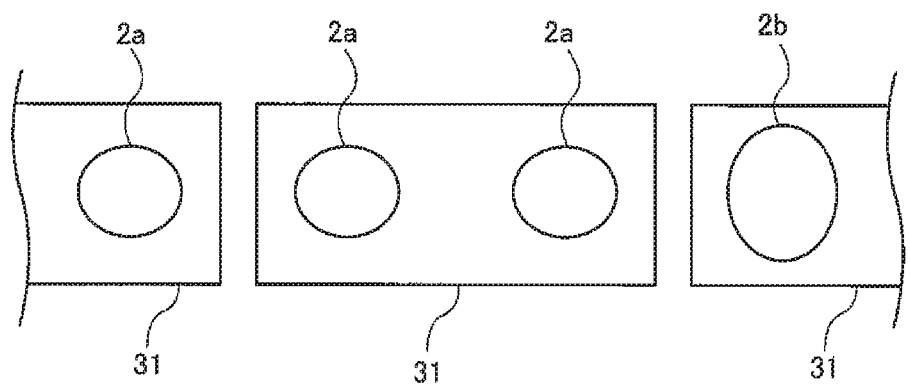
FIG. 3 is a plan view showing the schematic configuration of the principal sections of the magnetoresistive laminated body in the preferred embodiment of the present invention.
Figure 4:
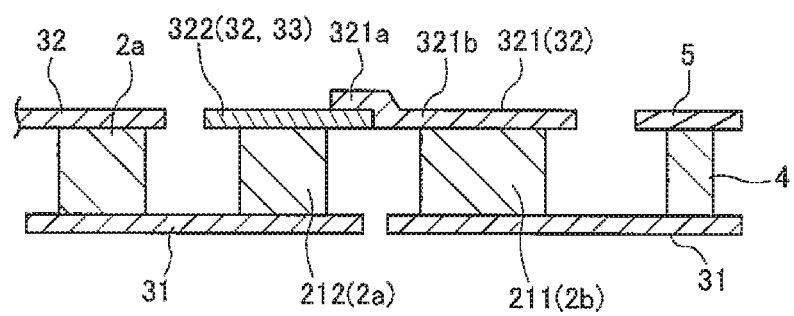
FIG. 4 is a cross-sectional view showing a schematic configuration of the principal sections of the magnetoresistive element according to the preferred embodiment of the present invention.

A preferred embodiment of the present invention will be described with reference to the drawings. FIG. 1 is a perspective view showing a schematic configuration of a magnetoresistive element according to a preferred embodiment of the present invention, FIG. 2 is a cross-sectional view showing a schematic configuration of a magnetoresistive laminated body in the preferred embodiment of the present invention, FIG. 3 is a plan view showing a schematic configuration of the principal sections of the magnetoresistive laminated body in the preferred embodiment of the present invention, and FIG. 4 is a cross-sectional view showing a schematic configuration of the principal sections of the magnetoresistive element according to the preferred embodiment of the present invention.

As shown in FIGS. 1~4, a magnetoresistive element 1 according to the preferred embodiment is provided with a plurality of magnetoresistive laminated bodies 2 arranged in an array and a plurality of lead electrodes 3 that electrically connect the plurality of magnetoresistive laminated bodies 2 in series.

Specifically, the magnetoresistive element 1 has a plurality of bottom lead electrodes 31, a plurality of magnetoresistive laminated bodies 2, and a plurality of top lead electrodes 32. The bottom lead electrodes 31 and the top lead electrodes 32 are, for example, configured by one type of conductive material among Cu, Al, Au, Ta, Ti or the like or a composite film of two or more of such conductive materials, and the thickness of each is 0.3~2.0 μm.

The plurality of bottom lead electrodes 31 is provided on a substrate (undepicted). Each of the plurality of bottom lead electrodes 31 has a long, slender, roughly rectangular shape and is provided so there is a prescribed gap between any two adjacent bottom lead electrodes 31 in the electrical series direction of the plurality of magnetoresistive laminated bodies 2 arranged in an array. Near each of the two ends in the lengthwise direction of the bottom lead electrodes 31, the magnetoresistive laminated bodies 2 are provided. That is, two magnetoresistive laminated bodies 2 are provided on top of each of the plurality of bottom lead electrodes 31.

The magnetoresistive laminated bodies 2 in the preferred embodiment are TMR elements, and, as shown in FIG. 2, include a magnetization fixed layer 22 in which the magnetization direction has been fixed, a free layer 24 in which the magnetization direction changes in accordance with the direction of the applied magnetic field, a non-magnetic layer 23 positioned between the magnetization fixed layer 22 and the free layer 24, and an antiferromagnetic layer 21.

The magnetoresistive laminated body 2 has a configuration in which the free layer 24, the non-magnetic layer 23, the magnetization fixed layer 22 and the antiferromagnetic layer 21 are laminated in that order from the bottom lead electrode 31 side. The free layer is electrically connected to the bottom lead electrode 31, and the antiferromagnetic layer 21 is electrically connected to the top lead electrode 32. As the material configuring the free layer 24 and the magnetization fixed layer 22, for example, NiFe, CoFe, CoFeB, CoFeNi, Co$_2$MnSi, Co$_2$MnGe, FeOX (oxides of Fe) or the like can be used. The thickness of the free layer 24 and the magnetization fixed layer 22 is around 1~10 nm each.

The non-magnetic layer 23 is a tunnel barrier layer, and is a required film in order to cause the tunnel magnetoresistive effect (TMR) effect to be expressed in the magnetoresistive laminated body 2 of the preferred embodiment. As materials configuring the non-magnetic layer 23, Cu, Au, Ag, Zn, Ga, TiO$_x$, ZnO, InO, SnO, GaN, ITO (Indium Tin Oxide), Al$_2$O$_3$, MgO or the like can be used. The non-magnetic layer 23 may be configured by a laminated film of two or more layers. For example, the non-magnetic layer 23 can be configured by a three-layer laminated film of Cu/ZnO/Cu, or a three-layer laminated film of Cu/ZnO/Zn, in which one of the Cu is replaced with Zn. The thickness of the non-magnetic layer 23 is around 0.1~5 nm.

The antiferromagnetic layer 21 is configured by an antiferromagnetic material containing Mn and at least one type of element selected from the group of Pt, Ru, Rh, Pd, Ni, Cu, Ir, Cr and Fe, for example. The Mn content in this antiferromagnetic material is, for example, around 35~95%. The antiferromagnetic layer 21 configured by this antiferromagnetic material serves the role of fixing the direction of magnetization of the magnetization fixed layer 22, through exchange coupling with the magnetization fixed layer 22.

A plurality of top lead electrodes 32 is provided on the plurality of magnetoresistive laminated bodies 2. Each top lead electrode 32 has a long, slender, roughly rectangular shape. The top lead electrode 32 is positioned so that a prescribed gap exists between two adjacent top lead electrodes 32 in the electrical series direction of the plurality of magnetoresistive laminated bodies 2 arranged in an array and so that the plurality of magnetoresistive laminated bodies 2 are connected in series, and the top lead electrode 32 electrically connects the antiferromagnetic layers 21 of the adjacent two magnetoresistive laminated bodies to each other. The magnetoresistive laminated body 2 may have a configuration in which the antiferromagnetic layer 21, the magnetization fixed layer 22, the non-magnetic layer 23 and the free layer 24 are sequentially layered from the bottom lead electrode 31 side. In addition, there may be a cap layer (protective layer) between the free layer 24 and the bottom lead electrode 31 or the top lead electrode 32.

In the magnetoresistive laminated bodies 2 in the embodiment, the resistance value changes in accordance with the angle formed by the magnetization direction of the free layer 24 with respect to the magnetization direction of the magnetization fixed layer 22, and the resistance value becomes a minimum when the angle is 0° (the magnetization directions are parallel) and the resistance value becomes a maximum at 180° (the magnetization directions are antiparallel).

As shown in FIG. 3, the plurality of magnetoresistive laminated bodies 2 arranged in an array in the magnetoresistive element 1 in the preferred embodiment contains a magnetoresistive laminated body 2a, the shape of which, when viewed from the top side (the top lead electrode 32 side) in the direction of lamination of the magnetoresistive laminated body 2, is substantially circular, and a magnetoresistive laminated body 2b with a substantially elliptical shape that differs from that of the magnetoresistive laminated body 2a In FIG. 3, the depiction of the top lead electrode 32 is omitted. In the preferred embodiment, the magnetoresistive laminated body 2a having the substantially circular shape at times will be referred to as the main TMR laminated body, and the magnetoresistive laminated body 2b having the substantially elliptical shape will at times be referred to as the correction-use TMR laminated body.

As described below, during manufacturing procedures for the magnetoresistive element 1 according to the preferred embodiment, changes in the resistance value accompanying changes in the external magnetic field are measured. In this resistance value change, harmonic distortion originating from manufacturing errors in the main TMR laminated body 2a (distortion in the shape of the main TMR laminated body 2a) are included. In the magnetoresistive element 1, it is ideal for the waveform exhibiting this change in resistance value to be a sine wave or a cosine wave. However, when harmonic distortion is included in this resistance value change, the waveform exhibiting this resistance value change deviates from the ideal sine wave or cosine wave. The magnetoresistive element 1 according to the preferred embodiment is such that by including the correction-use TMR laminated body 2b in order to make the waveform exhibiting the resistance value change approach the ideal sine wave or cosine wave, harmonic distortion included in the resistance value change of the magnetoresistive element 1 is corrected, and it is possible to make the waveform exhibiting the resistance value change of the magnetoresistive element 1 approach the ideal sine wave or cosine wave.

The shape and size of the correction-use TMR laminated body 2b are a shape and size capable of correcting the harmonic distortion originating from manufacturing errors or the like in the main TMR laminated body 2a (distortion in the shape of the main TMR laminated body 2a). For example, the shape of the correction-use TMR laminated body 2b may be substantially elliptical, differing from the substantially circular shape of the main TMR laminated body 2a. In addition, the size of the correction-use TMR laminated body 2b may be 1.5 times larger than the size of the main TMR laminated body 2a, and preferably 2~10 times. For example, the size of the main TMR laminated body 2a is around 1~2 µm, and the size of the correction-use TMR laminated body 2b is around 1.5~20 µm. The size of the magnetoresistive laminated body 2 refers to the diameter of the top surface when the shape is a circular shape when viewed from the top side (the top lead electrode 32 side) in the lamination direction of the magnetoresistive laminated body 2 and refers to the major axis of the top surface when the shape is an elliptical shape.

In the magnetoresistive element 1 according to the preferred embodiment, among the plurality of magnetoresistive laminated bodies 2 arranged in an array, at least an adjacent pair of the first magnetoresistive laminated body 211 and second laminated body 212 are electrically connected via a direct connection between a first lead electrode 321, which is connected to the top surface (antiferromagnetic layer 21) in the direction of lamination of the first magnetoresistive laminated body 211, and a second lead electrode 322, which is connected to the top surface (antiferromagnetic layer 21) in the direction of lamination of the second magnetoresistive laminated body 212 (see FIG. 4). The first magnetoresistive laminated body 211 in the preferred embodiment is a correction-use TMR laminated body 2b, and the second magnetoresistive laminated body 212 is a main TMR laminated body 2a adjacent to the correction-use TMR laminated body 2b in the series direction of the magnetoresistive laminated body 2.

As shown in FIG. 4, the first lead electrode 321 and the second lead electrode 322 are positioned substantially on the same plane and are directly connected. In other words, the first lead electrode 321 and the second lead electrode 322 are electrically connected without the magnetoresistive laminated body 2 interposed between, and the mutually directly connected first lead electrode 321 and second lead electrode 322 can configure the top lead electrode 32 that electrically connects the first magnetoresistive laminated body 211 and the second magnetoresistive laminated body 212. The fact that first lead electrode 321 and the second lead electrode 322 are positioned on substantially the same plane means that the second lead electrode 322 and a section 321b of the first lead electrode 321, other than a section 321a that overlaps the second lead electrode 322, are positioned on the same plane.

As described below, the magnetoresistive element 1 according to the preferred embodiment is manufactured by forming a correction-use TMR laminated body 2b that measures the resistance value change accompanying changes in the external magnetic field during the manufacturing process and corrects the difference when there is a difference between the waveform indicating the resistance value change and the ideal sine wave or cosine wave. The second lead electrode 322 is a measurement lead electrode 33 used to measure the resistance value change accompanying changes in the external magnetic field.

In this manner, after the above-described resistance value change is measured via the measurement lead electrode 33 (second lead electrode 322), the correction-use TMR laminated body 2b is formed, and all of the magnetoresistive laminated bodies 2 including the correction-use TMR laminated body 2b are connected in series. Consequently, in the magnetoresistive element 1 according to the preferred embodiment, there is at least one location where the first lead electrode 321 and the second lead electrode 322 are directly connected.

In the bottom lead electrode 31 where the correction-use TMR laminated body 2b is formed, a conductive layer 4 made of a conductive material is provided, and on the top surface of the conductive layer 4, an electrode pad 5 made of Au or the like is provided.

A method of manufacturing the magnetoresistive element 1 having the above-described configuration will be described. FIGS. 5A~5D and FIGS. 6A~6C are process flow charts showing manufacturing procedures for the magnetoresistive element 1 according to the preferred embodiment in cross sectional views.

Figure 5A:
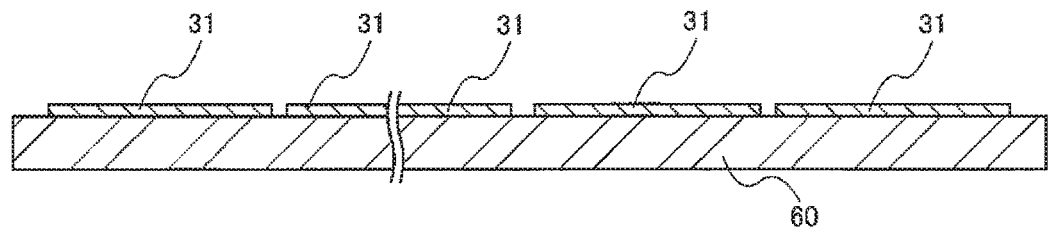
FIGS. 5A~5D are procedure flow diagrams showing, in cut end views, the manufacturing procedures for the magnetoresistive element according to the preferred embodiment of the present invention.
Figure 5B:
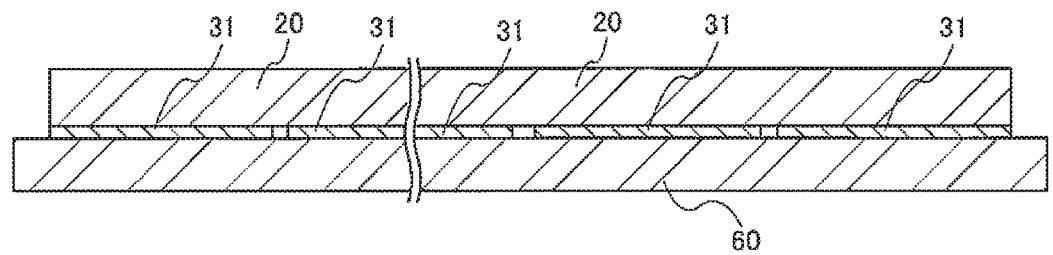

On a semiconductor substrate 60, a first conductive material film is formed through sputtering or the like, and a plurality of bottom lead electrodes 31 is formed through a photolithography process (see FIG. 5A). Further, between the bottom lead electrodes 31, an insulating layer (omitted from drawing) is provided.

Figure 5C:
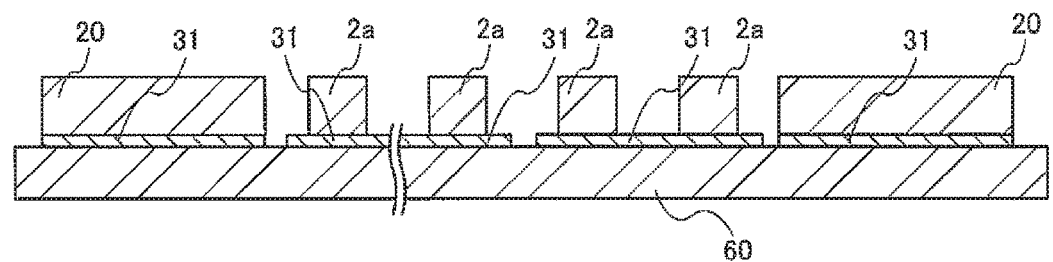

Next, a magnetoresistive film (a laminated film in which a ferromagnetic film, a nonmagnetic film, a ferromagnetic film and an antiferromagnetic film are sequentially layered) 20 is formed through sputtering or the like to cover the plurality of bottom lead electrodes 31 (see FIG. 5B), and the main TMR laminated body 2a is formed in a prescribed region in each of the plurality of bottom lead electrodes 31 through a photolithography process (see FIG. 5C).

The prescribed region where the correction-use TMR laminated body 2b is formed is covered by the magnetoresistive film 20. In the preferred embodiment, a state in which one correction-use TMR laminated body 2b is formed on each of two bottom lead electrodes 31 is used as an example, but this is intended to be illustrative and not limiting, and it would be fine to form one correction-use TMR laminated body 2b on one bottom lead electrode 31 or to form three or more correction-use TMR laminated bodies 2b.

Figure 5D:
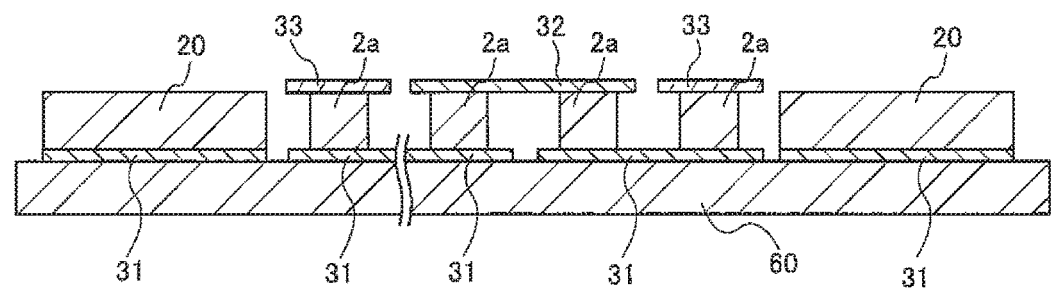

Next, a second conductive material film is formed through sputtering or the like on the plurality of main TMR laminated bodies 2a formed on the bottom lead electrodes 31, and top lead electrodes 32 and measurement lead electrodes 33 that connect in series the plurality of main TMR laminated bodies 2a are formed through a photolithography process (see FIG. 5D).

Furthermore, in the plurality of main TMR laminated bodies 2a connected in series by the bottom lead electrodes 31, the top lead electrodes 32 and the measurement lead electrodes 33, the resistance value change accompanying changes in external magnetic field are measured. This resistance value change is measured for example using a Quasi Static Test (QST) device (WLA-3000, made by Integral Solutions Int'l), or the like.

When the waveform indicating the resistance value change measured in this way has a difference from an ideal sine wave or cosine wave, a correction resistance value change required by the correction-use TMR laminated body 2b to correct this difference is found. The resistance value change in the magnetoresistive element 1 is expressed by the total of the resistance value change measured above (the resistance value change in the main TMR laminated body 2a) and the resistance value change in the correction-use TMR laminated body 2b. Consequently, the correction resistance value change required by the correction-use TMR laminated body 2b is found from the difference between the resistance value change in the main TMR laminated body 2a and the ideal resistance value change, so that the waveform indicating the resistance value change in the magnetoresistive element 1 approaches the idea sine wave or cosine wave.

Figure 7:
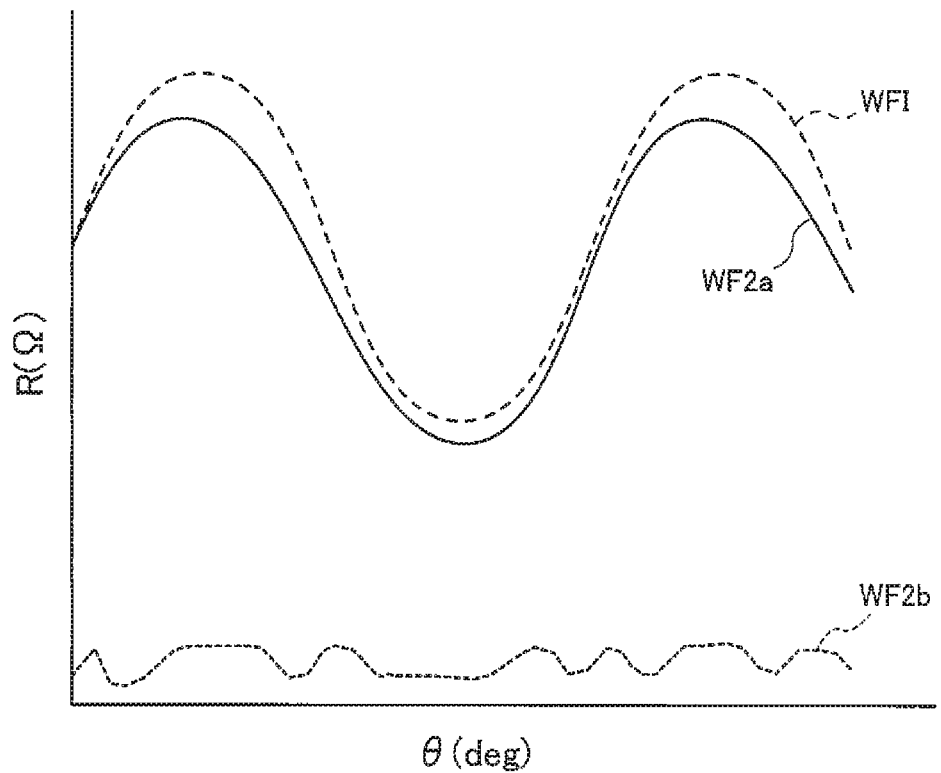
FIG. 7 is a graph showing an ideal waveform for resistance value changes in the magnetoresistive element according to the preferred embodiment of the present invention, the waveform of resistance value changes in the main TMR laminated body and the waveform of resistance value changes in the correction-use TMR laminated body.

For example, when a magnetoresistive element 1 including 50 magnetoresistive laminated bodies 2 is manufactured, first, forty-seven main TMR laminated bodies 2a are manufactured. The resistance value change in these forty-seven main TMR laminated bodies 2a accompanying changes in the external magnetic field is measured, and a waveform WF2a shown in FIG. 7 is obtained. FIG. 7 is a graph showing the ideal waveform WFI for resistance value change, a waveform WF2a of resistance value change in the main TMR laminated bodies 2a, and a waveform WF2b of resistance value change in the correction-use TMR laminated bodies in the magnetoresistive element 1 according to the preferred embodiment. In FIG. 7, the vertical axis indicates resistance value R (Ω), and the horizontal axis indicates the angle of rotation θ (deg). This waveform WF2a has prescribed differences from the ideal sine wave WFI. In this case, the waveform WF2b of correction resistance value change required by the correction-use TMR laminated bodies 2b to correct these differences is found. The waveform WF2b of correction resistance value changes is found by subtracting the waveform WF2a from the waveform WFI. In this manner, it is possible to find the correction resistance value changes required by the correction-use TMR laminated bodies 2b.

Correction of the resistance value changes in the plurality of main TMR laminated bodies 2a is accomplished only by adding the resistance value change in the correction-use TMR laminated bodies 2b to this resistance value change. That is to say, correction cannot be done by subtracting the resistance value from the resistance value change in the plurality of main TMR laminated bodies 2a. Depending on the extent of manufacturing errors (distortion in the shape of the main TMR laminated bodies 2a) arising in the main TMR laminated bodies 2a, cases may arise in which correction of the resistance value changes are difficult or impossible with only one correction-use TMR laminated body 2b. Hence, the number of correction-use TMR laminated bodies 2b in the plurality of magnetoresistive laminated bodies 2 included in the magnetoresistive element 1 may be determined after grasping in advance the extent of manufacturing errors or the like arising in the main TMR laminated bodies 2a.

On the other hand, when the number of correction-use TMR laminated bodies 2b in the plurality of magnetoresistive laminated bodies 2 is too large, harmonic distortions originating from manufacturing errors arising in the correction-use TMR laminated bodies 2b (distortions from the design shape of the correction-use TMR laminated bodies 2b) arise. Consequently, the number of correction-use TMR laminated bodies 2b is preferably determined by considering the extent of manufacturing errors arising in the main TMR laminated bodies 2a and the extent of manufacturing errors arising in the correction-use TMR laminated bodies 2b. For example, when fifty magnetoresistive laminated bodies 2 are included in the magnetoresistive element 1, preferably 1~4, or more preferably 2~4, correction-use TMR laminated bodies 2b are formed.

Furthermore, the size and shape of the correction-use TMR laminated bodies 2b are designed based on the correction resistance value change. When the difference between the resistance value change in the main TMR laminated bodies 2a and the ideal sine wave or cosine wave is substantially zero, magnetoresistive laminated bodies 2 of the same size and shape as the plurality of main TMR laminated bodies 2a are formed without forming correction-use TMR laminated bodies 2b in the predetermined regions for forming correction-use TMR laminated bodies 2b on the bottom lead electrode 31.

Figure 6A:
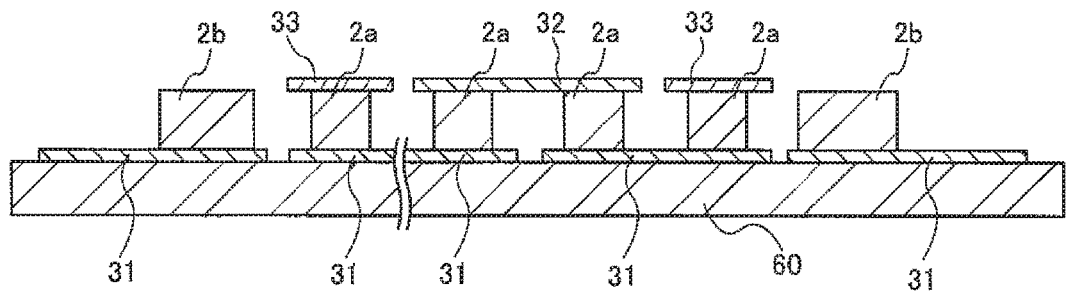
FIGS. 6A~6C are procedure flow diagrams showing, in cut end views, procedures following FIG. 5D, among the manufacturing procedures for the magnetoresistive element according to the preferred embodiment of the present invention.

Next, based on the above-described design, the correction-use TMR laminated bodies 2b are formed through a photolithography process (see FIG. 6A). The correction-use TMR laminated bodies 2b have shapes and sizes differing markedly from the main TMR laminated bodies 2a For example, the shape of the main TMR laminated bodies 2a is substantially circular, while the shape of the correction-use TMR laminated bodies 2b is elliptical with the major axis facing the short direction of the bottom lead electrode 31. The design of the shape and size of the correction-use TMR laminated bodies 2b is determined in the manufacturing processes of the magnetoresistive element 1 based on the resistance value change in the main TMR laminated bodies 2a, so it is impossible to prepare in advance the reticle or the like for forming the correction-use TMR laminated bodies 2b. Hence, the correction-use TMR laminated bodies 2b are formed, for example, through a photolithography process using the pattern formation technology of electron beam lithography or multiple exposure using the reticle used when forming the plurality of main TMR laminated bodies 2a.

Figure 6B:
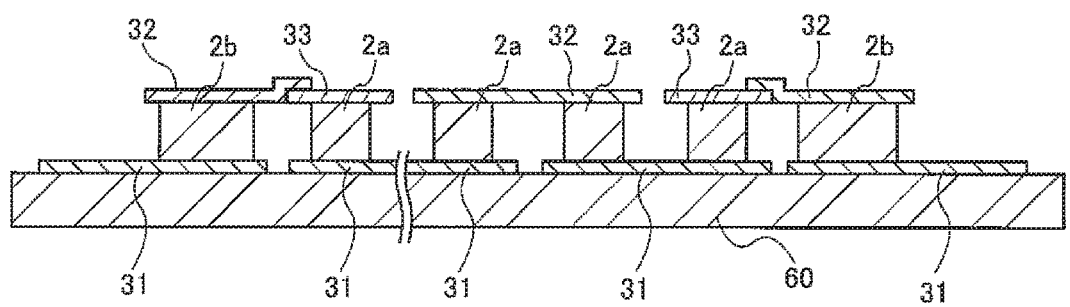
Figure 6C:
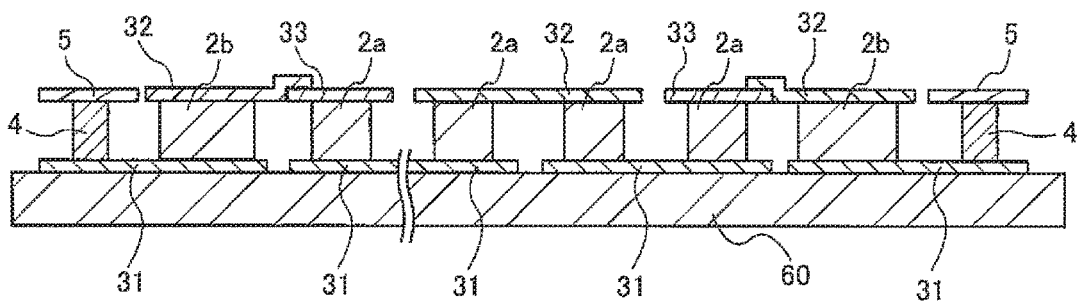

Then, the top lead electrodes 32 are formed on the top surface of the correction-use TMR laminated bodies 2b, and all of the magnetoresistive laminated bodies 2 including the correction-use TMR laminated bodies 2b are connected in series (see FIG. 6B). At this time, because the measurement lead electrodes 33 are formed in the magnetoresistive laminated bodies 2 (main TMR laminated bodies 2a) adjacent to the correction-use TMR laminated bodies 2b, the top lead electrodes 32 formed on the top surface of the correction-use TMR laminated bodies 2b and the measurement lead electrodes 33 are directly connected. Finally, the conductive layer 4 and the electrode pad 5 are formed on the bottom lead electrode 31 (see FIG. 6C). In this manner, the magnetoresistive element 1 according to the preferred embodiment is formed.

As discussed above, with the magnetoresistive element 1 according to the preferred embodiment, harmonic distortion originating from manufacturing errors or the like in the plurality of main TMR laminated bodies 2a included in the magnetoresistive element 1 are corrected by the correction-use TMR laminated bodies 2b, so it is possible to show a stable resistance value change accompanying changes in the external magnetic field. Accordingly, by using the magnetoresistive element 1 according to the preferred embodiment as one configuration element in a position detection device that detects the position of a moving body, it is possible to markedly improve position detection precision in the position detection device.

Figure 8:
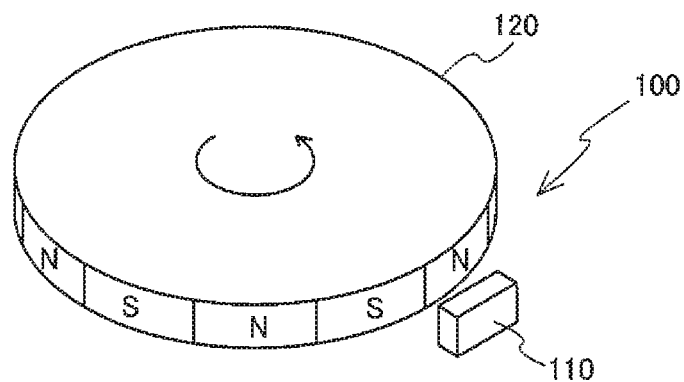
FIG. 8 is a perspective view showing a schematic configuration of a position detection device in the preferred embodiment of the present invention.
Figure 10:
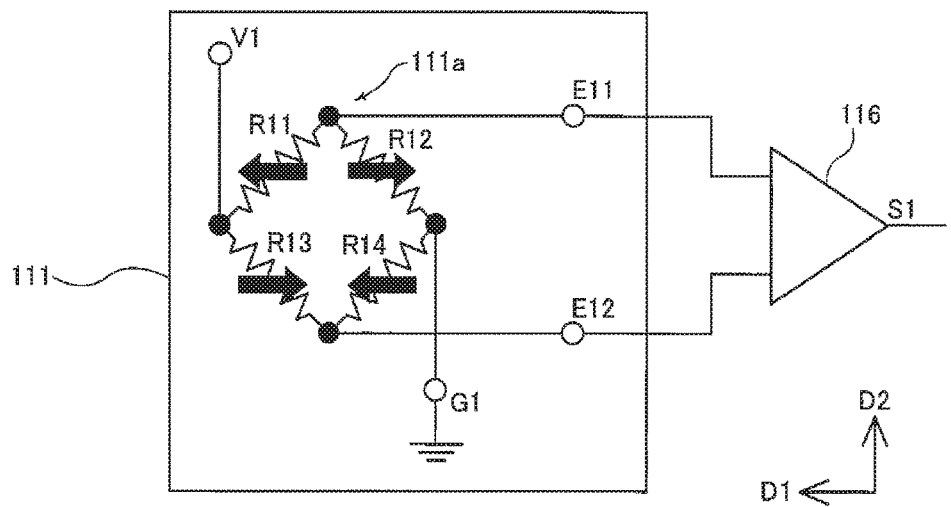
FIG. 10 is a circuit diagram schematically showing the circuit configuration of a first magnetic sensor unit in the preferred embodiment of the present invention.
Figure 11:
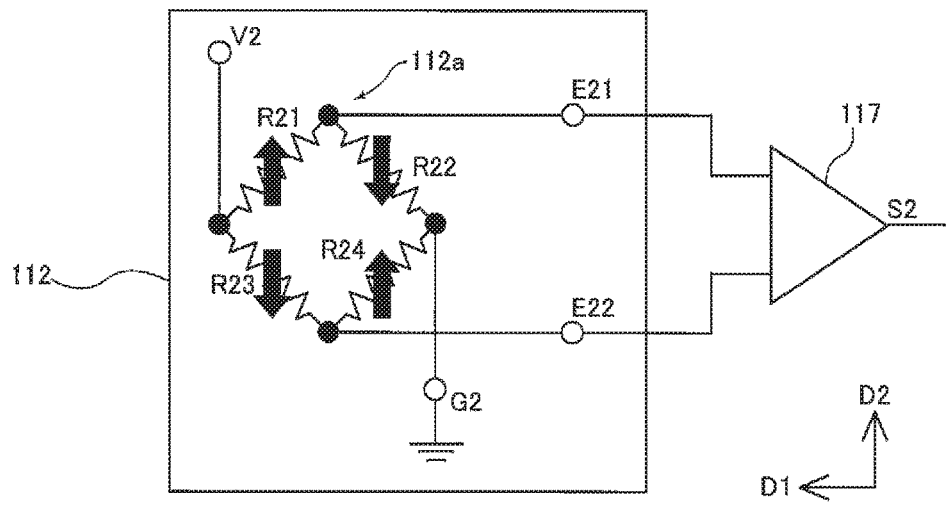
FIG. 11 is a circuit diagram schematically showing the circuit configuration of a second magnetic sensor unit in the preferred embodiment of the present invention.

Next, a position detection device using the magnetoresistive element 1 according to the preferred embodiment will be described. FIG. 8 is a perspective view showing a schematic configuration of a position detection device in the preferred embodiment, FIG. 9 is a block diagram showing a schematic configuration of a magnetic sensor in the preferred embodiment, FIG. 10 is a circuit diagram schematically showing the circuit configuration of a first magnetic sensor unit in the preferred embodiment, and FIG. 11 is a circuit diagram schematically showing the circuit configuration of a second magnetic sensor unit in the preferred embodiment.

As shown in FIG. 8, a position detection device 100 according to the preferred embodiment is provided with a magnetic sensor 110 and a moving body 120 capable of moving relative to the magnetic sensor 110. In the preferred embodiment, an example is described in which a rotary encoder provided with a rotating moving body 120 that rotates about a prescribed rotational axis is used as the position detection device 100, but this is intended to be illustrative and not limiting, and a rotary encoder or the like provided with a moving body 120 that moves linearly relative to a prescribed direction with respect the magnetic sensor 110 would be fine. In the state shown in FIG. 8, the rotating moving body 120 is a rotary magnet in which N poles and S poles are alternatingly magnetized about the outer perimeter.

Figure 9:
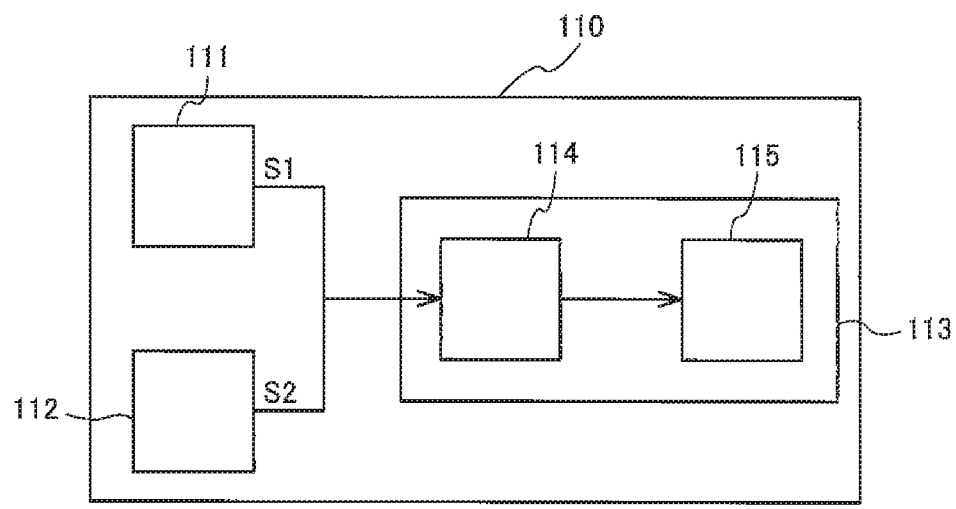
FIG. 9 is a block diagram showing a schematic configuration of a magnetic sensor in the preferred embodiment of the present invention.

As shown in FIG. 9, the magnetic sensor 110 includes a first magnetic sensor unit 111 and a second magnetic sensor unit 112 that output sensor signals based on changes in the external magnetic field accompanying rotational movement of the rotating moving body 120, and a calculator 113 that calculates the rotational angle θ of the rotating moving body 120 based on the sensor signals output from the first and second magnetic sensor units 111 and 112.

The calculator 113 contains an A/D (analog/digital) converter 114, which converts analog signals (sensor signals) output from the first and second magnetic sensor units 111 and 112 into digital signals, and an arithmetic processor 115, which does arithmetic processing on the digital signals digitally converted by the A/D converter 114 and calculates the rotation angle θ.

The first and second magnetic sensor units 111 and 112 each contain at least one magnetic detection element and may contain a pair of magnetic detection elements connected in series. In this case, the first and second magnetic sensor units 111 and 112 each have a Wheatstone bridge containing a pair of magnetic detection elements connected in series.

As shown in FIG. 10, a Wheatstone bridge circuit 111a of the first magnetic sensor unit 111 has a power source port V1, a ground port G1, two output ports E11 and E12, a first pair of magnetic detection elements R11 and R12 connected in series, and a second pair of magnetic detection elements R13 and R14 connected in series. One end of each of the magnetic detection elements R11 and R13 is connected to the power source port V1. The other end of the magnetic detection element R11 is connected to one end of the magnetic detection element R12 and the output port E11. The other end of the magnetic detection element R13 is connected to one end of the magnetic detection element R14 and the output port E12. The other end of each of the magnetic detection elements R12 and R14 is connected to the ground port G1. A power source voltage of a prescribed magnitude is applied to the power source port V1, and the ground port G1 is connected to ground.

As shown in FIG. 11, a Wheatstone bridge circuit 112a of the second magnetic sensor unit 112 has the same configuration as the Wheatstone bridge circuit 111a of the first magnetic sensor unit 111 and contains a power source port V2, a ground port G2, two output ports E21 and E22, a first pair of magnetic detection elements R21 and R22 connected in series, and a second pair of magnetic detection elements R23 and R24 connected in series. One end of each of the magnetic detection elements R21 and R23 is connected to the power source port V2. The other end of the magnetic detection element R21 is connected to one end of the magnetic detection element R22 and the output port E21. The other end of the magnetic detection element R23 is connected to one end of the magnetic detection element R24 and the output port E22. The other end of each of the magnetic detection elements R22 and R24 is connected to the ground port G2. A power source voltage of a prescribed magnitude is applied to the power source port V2, and the ground port G2 is connected to ground.

In the preferred embodiment, the magnetoresistive element 1 according to the preferred embodiment (see FIGS. 1~4) is used as all of the magnetic detection elements R11~R14 and R21~R24 contained in the Wheatstone bridge circuits 111a and 112a.

In FIG. 10 and FIG. 11, the magnetization directions of the magnetization fixed layers 22 of the magnetic detection elements R11~R14 and R21~R24 are indicated by the filled-in arrows. In the first magnetic sensor unit 111, the magnetization directions of the magnetization fixing layers 22 of the magnetic detection elements R11~R14 are parallel to a first direction D1, and the magnetization directions of the magnetization fixed layers 22 of the magnetic detection elements R11 and R14, and the magnetization direction of the magnetization fixed layers 22 of the magnetic detection elements R12 and R13, are mutually antiparallel directions. In addition, in the second magnetic sensor unit 112, the magnetization directions of the magnetization fixed layers 22 of the magnetic detection elements R21~R24 are parallel to a second direction orthogonal to the first direction, and the magnetization directions of the magnetization fixed layers 22 of the magnetic detection elements R21 and R24, and the magnetization direction of the magnetization fixed layers 22 of the magnetic detection elements R22 and R23, are mutually antiparallel. In the first and second magnetic sensor units 111 and 112, the potential differences between the output ports E11 and E12 and the output ports E21 and E22 change in accordance with changes in the direction of the magnetic field accompanying rotational movement of the rotating moving body 120, and first and second sensor signals S1 and S2 are output to the calculator 113 as signals indicating magnetic field strength.

A difference detector 116 outputs a signal corresponding to the electric potential difference between the output ports E11 and E12 to the A/D converter 114 as the first sensor signal S1. A difference detector 117 outputs a signal corresponding to the electric potential difference between the output ports E21 and E22 to the A/D converter 114 as the second sensor signal S2.

As shown in FIG. 10 and FIG. 11, the magnetization direction of the magnetization fixed layers 22 of the magnetic detection elements R11~R14 in the first magnetic sensor unit 111 and the magnetization direction of the magnetization fixed layers 22 of the magnetic detection elements R21~R24 in the second magnetic sensor unit 112 are mutually orthogonal. In this case, the waveform of the first sensor signal S1 is a cosine wave dependent on the rotational angle θ, and the waveform of the second sensor signal S2 is a sine wave dependent on the rotational angle θ. In the preferred embodiment, the phase of the second sensor signal S2 differs by one quarter of a signal period, that is to say π/2 (90°), relative to the phase of the first sensor signal S1.

The A/D converter 114 converts the first and second sensor signals (analog signals related to the rotational angle θ) S1 and S2 output from the first and second magnetic sensor units 111 and 112 into digital signals, and these digital signals are input into the arithmetic processor 115.

The arithmetic processor 115 does arithmetic processing on the digital signals converted from analog signals by the A/D converter 114, and calculates the rotational angle θ of the rotating moving body 120. The arithmetic processor 115 is configured by a microcomputer or the like, for example.

The rotational angle θ of the rotating moving body 120 is calculated by an arctangent computation such as that indicated by the below equation, for example.

$$\theta = \operatorname{atan}(S1/S2)$$

Within a 360° range, there are two solutions differing by 180° for the rotational angle θ in the above equation. However, by the positive/negative combination of the first sensor signal S1 and the second sensor signal S2, it is possible to determine which of the two solutions to the above equation is the true value of the rotational angle θ. That is to say, when the first sensor signal S1 has a positive value, the rotational angle θ is larger than 0° and smaller than 180°. When the first sensor signal S1 has a negative value, the rotational angle θ is larger than 180° and smaller than 360°. When the second sensor signal S2 has a positive value, the rotational angle θ is in the range larger than 0° and smaller than 90° or larger than 270° and smaller than 360°. When the second sensor signal S2 has a negative value, the rotational angle θ is larger than 90° and smaller than 270°. The arithmetic processor 115 calculates the rotational angle θ within the 360° range based on the above equation and a determination of the positive/negative combination of the first sensor signal S1 and the second sensor signal S2.

In the position detection device 100 in the preferred embodiment having the above-described configuration, when the external magnetic field changes accompanying rotational movement of the rotating moving body 120, the resistance values of the magnetic detection elements R11~R14 and R21~R24 of the first and second magnetic sensor unit 111 and 112 change in accordance with the change in that external magnetic field, and the first and second sensor signals S1 and S2 are output from the difference detectors 116 and 117 in accordance with the electric potential difference of the respective output ports E11, E12, E21 and E22 of the first magnetic sensor unit 111 and second magnetic sensor unit 112. Then, the first sensor signal S1 and the second sensor signal S2 output from the difference detectors 116 and 117 are converted into digital signals by the A/D converter 114. Following this, the rotational angle θ of the rotating moving body 120 is calculated by the arithmetic processor 115.

In the position detection device 100 in the preferred embodiment, the magnetic detection elements R11~R14 and R21~R24 (magnetoresistive elements 1) of the first and second magnetic sensor units 111 and 112 can contain correction-use TMR laminated bodies 2b, so it is possible to exhibit a stable resistance value change accompanying changes in the external magnetic field. Hence, with the position detection device 100 in the preferred embodiment, it is possible to detect the rotational angle θ of the rotating moving body 120 with high precision.

The preferred embodiment described above was described to facilitate understanding of the present invention, and is not intended to limit the present invention. Accordingly, the various elements disclosed in the above-described preferred embodiment should be construed to include all design changes and equivalents falling within the technical scope of the present invention.

Figure 12:
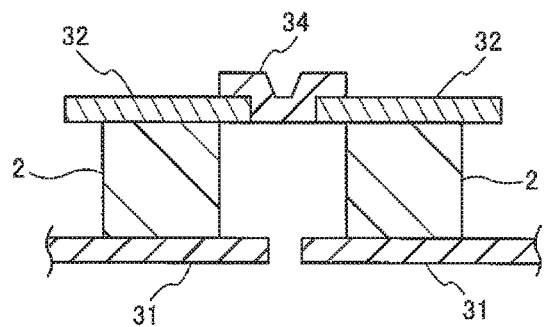
FIG. 12 is a cross-sectional view showing the schematic configuration of the principal sections of the magnetoresistive element according to another embodiment of the present invention.

In the above-described preferred embodiment, a state in which adjacent top lead electrodes 32 were directly connected to each other was used as an example, but the present invention is not limited to such a state. For example, as shown in FIG. 12, adjacent top lead electrodes 32 may be connected to each other via an electrode connection lead 34. In addition, adjacent bottom lead electrodes 31 may be connected to each other directly or via the electrode connection lead 34.

In the above-described preferred embodiment, a state in which the Wheatstone bridge circuits 111a and 112a contained in the first and second magnetic sensor units 111 and 112 are full bridge circuits containing a first pair of magnetic detection elements R11, R12, R21 and R22 connected in series and a second pair of magnetic detection elements R13, R14, R23 and R24 connected in series was used as an example, but the present invention is not limited to such a state. For example, these Wheatstone bridge circuits 111a and 112a may be half bridge circuits containing a first pair of magnetic detection elements R11, R12, R21 and R22 connected in series.

DESCRIPTION OF REFERENCE SYMBOLS

1. Magnetoresistive element
2. Magnetoresistive laminated body
   2a. Main TMR laminated body
   2b. Correction-use TMR laminated body
3. Lead electrode
   31. Bottom lead electrode
   32. Top lead electrode
      321. First lead electrode
      322. Second lead electrode
   33. Measurement lead electrode
   34. Electrode connection lead

What is claimed is:

1. A position detection device comprising:
    a magnetic sensor unit that outputs a sensor signal based on changes in an external magnetic field accompanying movements of a moving body; and
    a position detection unit that detects the position of the moving body, based on the sensor signal output from the magnetic sensor unit, wherein
    the magnetic sensor unit includes a magnetoresistive element,
    the magnetoresistive element comprises a plurality of magnetoresistive laminated bodies arranged in an array and a plurality of lead electrodes that electrically connect the plurality of magnetoresistive laminated bodies in series,
    the plurality of magnetoresistive laminated bodies includes a first magnetoresistive laminated body and a second magnetoresistive laminated body, which is adjacent in the series direction to the first magnetoresistive laminated body,
    the plurality of lead electrodes includes a first lead electrode, which is electrically connected to a first surface in the lamination direction of the first magnetoresistive laminated body, and a second lead electrode, which is electrically connected to the first surface in the lamination direction of the second magnetoresistive laminated body and positioned substantially coplanar with the first lead electrode, and
    the first lead electrode and the second lead electrode are electrically connected without the magnetoresistive body being interposed between the first lead electrode and the second lead electrode.

2. The position detection device according to claim 1, wherein:

the moving body is a rotating moving body that rotationally moves about a prescribed axis of rotation; and the position detection unit detects the rotational position of the rotating moving body based on the sensor signal output from the magnetic sensor unit.

3. The position detection device according to claim 1, wherein:

the magnetoresistive element further comprises at least one electrode connection lead that directly connects at least two lead electrodes among the plurality of lead electrodes, and the first lead electrode and the second lead electrode are connected via the electrode connection lead.

4. The position detection device according to claim 1, wherein when viewed along the lamination direction of the magnetoresistive laminated body, at least one of the magnetoresistive laminated bodies included in the plurality of magnetoresistive laminated bodies has a shape and/or size differing from the other magnetoresistive laminated bodies.

5. The position detection device according to claim 4, wherein in a planar view from a first surface side of the magnetoresistive laminated body, at least one of the magnetoresistive laminated bodies has a substantially elliptical shape, and the other magnetoresistive laminated bodies have substantially circular shapes.

6. The position detection device according to claim 4, wherein in a planar view from a first surface side of the magnetoresistive laminated body, the size of at least one of the magnetoresistive laminated bodies is at least 1.5 times larger than the sizes of the other magnetoresistive laminated bodies.

7. The position detection device according to claim 1, wherein the magnetoresistive laminated bodies are TMR laminated bodies.

* * * * *